(12) United States Patent
Koo

(10) Patent No.: US 12,495,600 B2
(45) Date of Patent: Dec. 9, 2025

(54) SEMICONDUCTOR DEVICE

(71) Applicant: DB HiTek Co., Ltd., Seoul (KR)

(72) Inventor: Ja Geon Koo, Chungcheongbuk-do (KR)

(73) Assignee: DB HiTek Co., Ltd., Seoul (KR)

( * ) Notice: Subject to any disclaimer, the term of this patent is extended or adjusted under 35 U.S.C. 154(b) by 381 days.

(21) Appl. No.: 18/144,356

(22) Filed: May 8, 2023

(65) Prior Publication Data

US 2024/0339515 A1 Oct. 10, 2024

(30) Foreign Application Priority Data

Apr. 10, 2023 (KR) .................. 10-2023-0046701

(51) Int. Cl.
*H10D 64/27* (2025.01)
*H10D 84/83* (2025.01)
*H10D 89/60* (2025.01)

(52) U.S. Cl.
CPC ......... *H10D 64/519* (2025.01); *H10D 64/518* (2025.01); *H10D 84/83* (2025.01); *H10D 89/711* (2025.01)

(58) Field of Classification Search
CPC .. H10D 64/519; H10D 64/518; H10D 64/517; H10D 84/83; H10D 89/711; H10D 62/115; H10D 62/126; H10D 62/137; H10D 86/201
See application file for complete search history.

(56) References Cited

U.S. PATENT DOCUMENTS

| | | | |
|---|---|---|---|
| 6,552,396 B1 | 4/2003 | Bryant et al. | |
| 7,015,542 B2* | 3/2006 | Kasuya | H10D 30/691 |
| | | | 257/326 |
| 8,390,048 B2* | 3/2013 | Sakai | H10D 84/0177 |
| | | | 257/314 |
| 2003/0057505 A1* | 3/2003 | Ebina | H10D 30/40 |
| | | | 257/411 |
| 2011/0248344 A1* | 10/2011 | Nitta | H10D 30/673 |
| | | | 257/347 |
| 2016/0284695 A1* | 9/2016 | Liaw | H10D 84/0151 |
| 2019/0386013 A1* | 12/2019 | Okazaki | H10B 69/00 |

FOREIGN PATENT DOCUMENTS

| | | |
|---|---|---|
| KR | 1020130056156 A | 5/2013 |
| KR | 101632279 B1 | 6/2016 |
| KR | 1020210125594 A | 10/2021 |

* cited by examiner

*Primary Examiner* — Dao H Nguyen
(74) *Attorney, Agent, or Firm* — Dinsmore & Shohl LLP; Yongsok Choi, Esq.

(57) ABSTRACT

A semiconductor device is provided. The semiconductor device includes a substrate including first and second regions and a third region between the first and second regions, a first gate electrode of a first transistor extending along a first direction on the third region, a second gate electrode of a second transistor spaced apart from the first gate electrode in a second direction on the third region and extending along the first direction, a first common region extending from the third region to the first region and disposed between the first gate electrode and the second gate electrode, a first body region extending from the third region to the first region and disposed below the second gate electrode, a first insulating portion between the first common region and the first body region in the first region and a connection region connecting the first common region and the first body region.

10 Claims, 3 Drawing Sheets

SEMICONDUCTOR DEVICE

CROSS-REFERENCE TO RELATED APPLICATION

This application claims priority to Korean Patent Application No. 10-2023-0046701 filed on Apr. 10, 2023, the entire contents of which are herein incorporated by reference.

BACKGROUND

(a) Field of the Invention

The disclosure relates to a semiconductor device.

(b) Description of the Related Art

The statements in this section merely provide background information related to the disclosure and may not constitute prior art.

In the case of a low noise amplifier (LNA) used in an RF front end (RFFE) circuit, it is used to amplify a received signal while reducing noise as much as possible. For a circuit used in an LNA circuit, a common source circuit and a common gate circuit are used for sufficient gain.

On the other hand, while the LNA circuit is operating, holes may be accumulated by a drain current, which may destabilize a current flowing in the common region shared by the common source circuit and the common gate circuit, thereby destabilizing an operation of a transistor itself.

Therefore, there is a need for a circuit structure capable of securing a high gain while stabilizing the operation of the transistor of the LNA.

SUMMARY

An aspect of the disclosure is to provide a semiconductor device that includes a common region shared by a common source circuit and a common gate circuit through a dual gate configuration.

Another aspect of the disclosure is to provide a semiconductor device that connects a common region and a body region.

Another aspect of the disclosure is to provide a semiconductor device that allows a length of a gate electrode of a common source circuit and a length of a gate electrode of a common gate circuit to be different from each other.

According to some aspects of the disclosure, a semiconductor device includes a substrate including first and second regions that are different from each other and a third region between the first and second regions, a first gate electrode of a first transistor extending along a first direction on the third region of the substrate, a second gate electrode of a second transistor spaced apart from the first gate electrode in a second direction crossing the first direction on the third region of the substrate and extending along the first direction, a first common region extending from the third region to the first region along the first direction and disposed between the first gate electrode and the second gate electrode, a first body region extending from the third region to the first region along the first direction and disposed below the second gate electrode, a first insulating portion between the first common region and the first body region in the first region and a connection region connecting the first common region and the first body region in the first region.

According to some aspects, the substrate includes a first portion and a second portion on the first portion, and the first body region is disposed in the second portion of the substrate and is connected to the first portion of the substrate.

According to some aspects, the first common region is disposed in the second portion of the substrate and is connected to the first portion.

According to some aspects, the semiconductor device further includes a third gate electrode of a third transistor extending along the first direction and spaced apart from the second gate electrode in the second direction on the third region of the substrate, a fourth gate electrode of a fourth transistor extending along the first direction and spaced apart from the third gate electrode in the second direction on the third region of the substrate, a second common region extending from the third region to the first region along the first direction and disposed between the third gate electrode and the fourth gate electrode, a second body region extending from the third region to the first region along the first direction and disposed below the third gate electrode and a second insulating portion between the second common region and the second body region, in the first region, wherein the connection region connects the second common region and the second body region in the first region.

According to some aspects, the substrate includes a first portion and a second portion on the first portion, the first body region is disposed in the second portion of the substrate and is connected to the first portion between the second gate electrode and the first portion, and the second body region is disposed in the second portion of the substrate and is connected to the first portion between the third gate electrode and the first portion.

According to some aspects, each of the first common region and the second common region is disposed in the second portion of the substrate and is connected to the first portion.

According to some aspects, the semiconductor device further includes a third insulating portion between the first body region and the second body region in the first region.

According to some aspects, the semiconductor device further includes a first gate connection portion connecting the first gate electrode and the fourth gate electrode to each other in the first region and a second gate connection portion connecting the second gate electrode and the third gate electrode to each other in the second region.

According to some aspects, the first common region and the first body region do not extend to the second region.

According to some aspects, a width of the second gate electrode in the second direction is larger than a width of the first gate electrode in the second direction.

Aspects of the disclosure are not limited to the above-described aspects, and other aspects can be appreciated by those skilled in the art from the following descriptions. Further, it will be easily appreciated that the aspects of the disclosure can be practiced by features recited in the appended claims and a combination thereof.

According to the semiconductor device of the disclosure, a common region shared by a common source circuit and a common gate circuit and a body region are connected through a dual gate configuration, thereby increasing resistance between the common region and a drain region of the common gate circuit to increase a gain.

In addition, the semiconductor device of the disclosure may stabilize a current flowing in a common region and stabilize an operation of a circuit by connecting a body region to a substrate.

In addition, according to the semiconductor device of the disclosure, by allowing a length of a gate electrode of a common source circuit to be different from a length of a gate electrode of a common gate circuit, a gain of a circuit may be improved.

In addition to what has been described, specific effects of the disclosure will be described together while describing specific details for carrying out the disclosure.

DETAILED DESCRIPTION OF THE EMBODIMENTS

Figure 1:
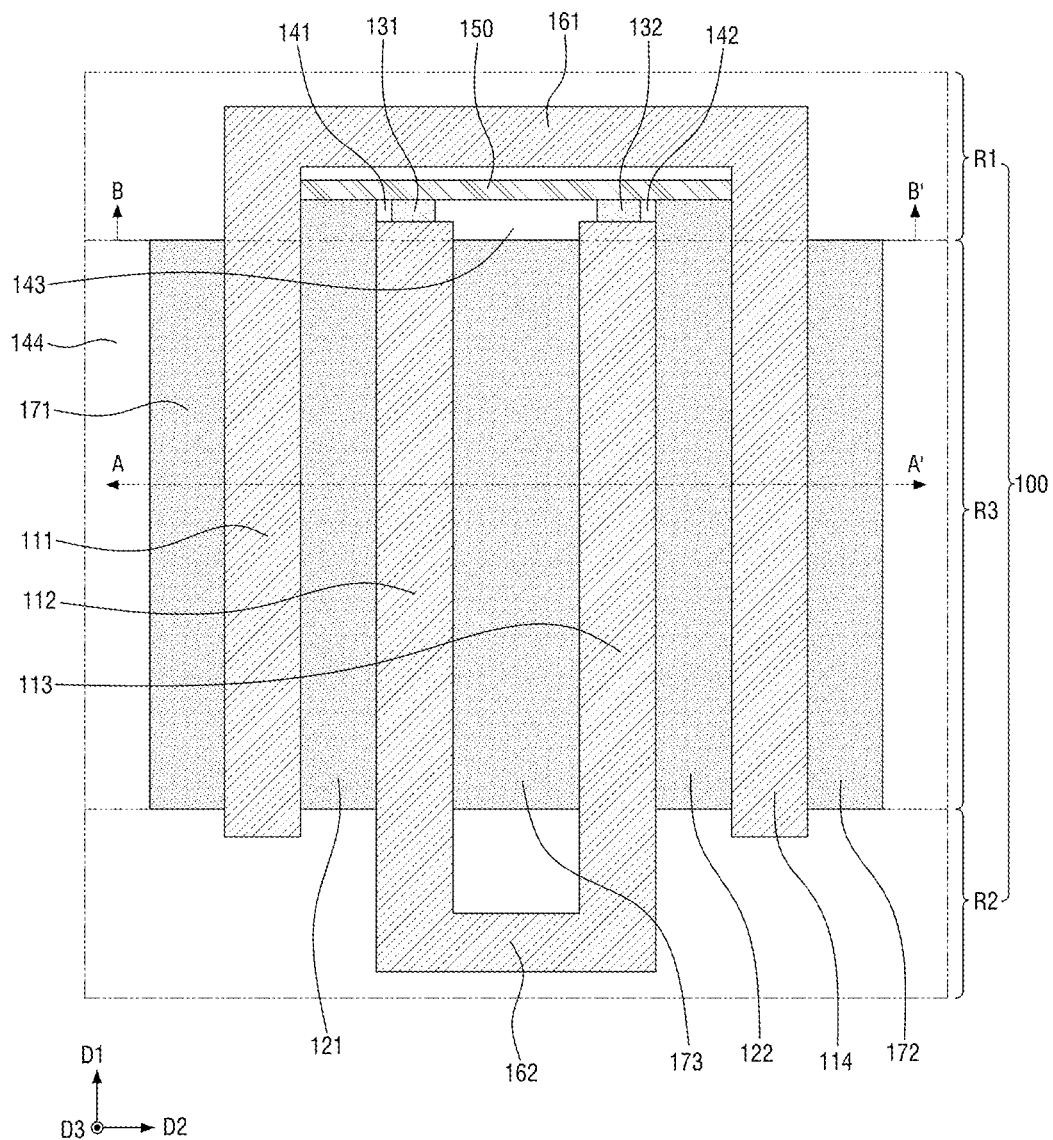
FIG. 1 illustrates a top plan view of a semiconductor device according to an embodiment of the disclosure.

The terms or words used in the disclosure and the claims should not be construed as limited to their ordinary or lexical meanings. They should be construed as the meaning and concept in line with the technical idea of the disclosure based on the principle that the inventor can define the concept of terms or words in order to describe his/her own inventive concept in the best possible way. Further, since the embodiment described herein and the configurations illustrated in the drawings are merely one embodiment in which the disclosure is realized and do not represent all the technical ideas of the disclosure, it should be understood that there may be various equivalents, variations, and applicable examples that can replace them at the time of filing this application.

Although terms such as first, second, A, B, etc. used in the description and the claims may be used to describe various components, the components should not be limited by these terms. These terms are only used to differentiate one component from another. For example, a first component may be referred to as a second component, and similarly, a second component may be referred to as a first component, without departing from the scope of the disclosure. The term 'and/or' includes a combination of a plurality of related listed items or any item of the plurality of related listed items.

The terms used in the description and the claims are merely used to describe particular embodiments and are not intended to limit the disclosure. Singular forms are intended to include plural forms unless the context clearly indicates otherwise. In the application, terms such as "comprise," "comprise," "have," etc. should be understood as not precluding the possibility of existence or addition of features, numbers, steps, operations, components, parts, or combinations thereof described herein.

Unless otherwise defined, the phrases "A, B, or C," "at least one of A, B, or C," or "at least one of A, B, and C" may refer to only A, only B, only C, both A and B, both A and C, both B and C, all of A, B, and C, or any combination thereof.

Unless being defined otherwise, all terms used herein, including technical or scientific terms, have the same meaning as commonly understood by those skilled in the art to which the disclosure pertains.

Terms such as those defined in commonly used dictionaries should be construed as having a meaning consistent with the meaning in the context of the relevant art, and are not to be construed in an ideal or excessively formal sense unless explicitly defined in the application. In addition, each configuration, procedure, process, method, or the like included in each embodiment of the disclosure may be shared to the extent that they are not technically contradictory to each other.

Hereinafter, a semiconductor device according to some embodiments of the disclosure will be described with reference to FIG. 1, FIG. 2, and FIG. 3.

FIG. 1 illustrates a top plan view of a semiconductor device according to an embodiment of the disclosure.

Referring to FIG. 1, the semiconductor device may include a substrate 100, a first gate electrode 111, a second gate electrode 112, a third gate electrode 113, a fourth gate electrode 114, a first common region 121, a second common region 122, a first body region 131, a first insulating portion 141, a second insulating portion 142, a third insulating portion 143, a fourth insulating portion 144, a first source region 171, a second source region 172, a drain region 173, a first gate connection portion 161, a second gate connection portion 162, and a connection region 150.

The substrate 100 may include a first region R1, a second region R2, and a third region R3. The first region R1, the second region R2, and the third region R3 may be different regions of the substrate 100. The third region R3 may be a region between the first region R1 and the second region R2.

The substrate 100 may be, for example, bulk silicon or silicon-on-insulator (SOI). Alternatively, the substrate 100 may be a silicon substrate, or may include another material such as a silicon germanium, an indium antimonide, a lead telluride, an indium arsenide, an indium phosphide, a gallium arsenide, or a gallium antimonide. Alternatively, the substrate 100 may have an epitaxial layer formed on a base substrate.

The first region R1 of the substrate 100 may include the first gate connection portion 161 and the connection region 150.

The second region R2 of the substrate 100 may include the second gate connection portion 162.

The third region R3 of the substrate 100 may include the fourth insulating portion 144, a first transistor, a second transistor, a third transistor, and a fourth transistor.

The first transistor may include the first source region 171, the first gate electrode 111, and the first common region 121. The first transistor may be, for example, a common source circuit. The second transistor may include the first common region 121, the second gate electrode 112, and the drain region 173. The second transistor may be, for example, a common gate circuit. The third transistor may include the drain region 173, the third gate electrode 113, and the second common region 122. The third transistor may be, for example, a common gate circuit. The fourth transistor may include the second common region 122, the fourth gate electrode 114, and the second source region 172. The fourth transistor may be, for example, a common source circuit.

The first gate electrode 111 may extend along a first direction D1 on the third region R3 of the substrate 100. The first gate electrode 111 may extend from the third region R3 to the first region R1 of the substrate 100 to be connected to the first gate connection portion 161 in the first region R1.

The second gate electrode 112 may extend along the first direction D1 on the third region R3 of the substrate 100. The second gate electrode 112 may be spaced apart from the first gate electrode 111 in a second direction D2 crossing the first direction D1. The second gate electrode 112 may extend from the third region R3 to the second region R2 of the substrate 100 to be connected to the second gate connection portion 162 in the second region R2.

The third gate electrode 113 may extend along the first direction D1 on the third region R3 of the substrate 100. The third gate electrode 113 may be spaced apart from the second gate electrode 112 in the second direction D2. The third gate electrode 113 may extend from the third region R3 to the second region R2 of the substrate 100 to be connected to the second gate connection portion 162 in the second region R2.

The fourth gate electrode 114 may extend along the first direction D1 on the third region R3 of the substrate 100. The fourth gate electrode 114 may extend from the third region R3 to the first region R1 of the substrate 100 to be connected to the first gate connection portion 161 in the first region R1.

The first gate connection portion 161 may connect the first gate electrode 111 and the fourth gate electrode 114 on the first region R1 of the substrate 100. The first gate connection portion 161 may extend, for example, in the second direction D2.

The second gate connection portion 162 may connect the second gate electrode 112 and the third gate electrode 113 on the second region R2 of the substrate 100. The second gate connection portion 162 may extend, for example, along the second direction D2.

The first gate electrode 111, the second gate electrode 112, the third gate electrode 113, and the fourth gate electrode 114 may include a conductive material. The first gate connection portion 161 may include the same material as the first gate electrode 111 and the fourth gate electrode 114. The second gate connection portion 162 may include the same material as the second gate electrode 112 and the third gate electrode 113.

The first source region 171 may be disposed at one side of the first gate electrode 111 in the third region R3 of the substrate 100. The first source region 171 may extend in the first direction D1 in the third region R3 of the substrate 100. The first source region 171 may include, for example, n-type impurities.

The first common region 121 may extend from the third region R3 of the substrate 100 to the first region R1 along the first direction D1. The first common region 121 may be disposed at the other side of the first gate electrode 111. The first common region 121 may be disposed at one side of the second gate electrode 112. The first common region 121 may be disposed between the first gate electrode 111 and the second gate electrode 112. The first common region 121 may be connected to the connection region 150 in the first region R1. For example, the first common region 121 may directly contact the connection region 150 in the first region R1.

The first common region 121 may be a source/drain region shared by the first transistor (for example, a common source amplifier) and the second transistor (for example, a common gate amplifier). The first common region 121 may include n-type impurities.

The drain region 173 may be disposed at the other side of the second gate electrode 112 in the third region R3 of the substrate 100. The drain region 173 may extend in the first direction D1 in the third region R3 of the substrate 100. The drain region 173 may include, for example, n-type impurities.

The second common region 122 may extend from the third region R3 of the substrate 100 to the first region R1 along the first direction D1. The second common region 122 may be disposed at the other side of the third gate electrode 113. The second common region 122 may be disposed at one side of the fourth gate electrode 114. The second common region 122 may be disposed between the third gate electrode 113 and the fourth gate electrode 114. The second common region 122 may be connected to the connection region 150 in the first region R1. For example, the second common region 122 may directly contact the connection region 150 in the first region R1.

The second source region 172 may be disposed at the other side of the fourth gate electrode 114 in the third region R3 of the substrate 100. The second source region 172 may extend in the first direction D1 in the third region R3 of the substrate 100. The second source region 172 may include, for example, n-type impurities.

The first body region 131 may extend from the third region R3 of the substrate 100 to the first region R1 along the first direction D1. The first body region 131 may be connected to the connection region 150 in the first region R1. For example, the first body region 131 may directly contact the connection region 150 in the first region R1. The first body region 131 may be disposed below the second gate electrode 112. The first body region 131 may include, for example, p-type impurities.

The second body region 132 may extend from the third region R3 of the substrate 100 to the first region R1 along the first direction D1. The second body region 132 may be connected to the connection region 150 in the first region R1. For example, the second body region 132 may directly contact the connection region 150 in the first region R1. The second body region 132 may be disposed below the third gate electrode 113. The second body region 132 may include, for example, p-type impurities.

The connection region 150 may connect the first common region 121, the first body region 131, the second body region 132, and the second common region 122 in the first region R1 of the substrate 100. For example, the connection region 150 may be in direct contact with each of the first common region 121, the first body region 131, the second body region 132, and the second common region 122 in the first region R1 of the substrate 100. At least a portion of the connection region 150 may be formed in the substrate 100 in the first region R1.

The connection region 150 may not be formed in the second region R2. For example, the first common region 121, the first body region 131, the second body region 132, and the second common region 122 may not extend into the second region R2.

The connection region 150 may include p-type impurities.

The first insulating portion 141 may be disposed between the first common region 121 and the first body region 131 in the first region R1 of the substrate 100. The first insulating portion 141 may directly contact the connection region 150 in the first region R1 of the substrate 100.

The second insulating portion 142 may be disposed between the second common region 122 and the second body region 132 in the first region R1 of the substrate 100. The second insulating portion 142 may directly contact the connection region 150 in the first region R1 of the substrate 100.

The third insulating portion 143 may be disposed between the first body region 131 and the second body region 132 in the first region R1 of the substrate 100. The third insulating portion 143 may directly contact the connection region 150 in the first region R1 of the substrate 100. The third insulating portion 143 may be disposed between the connection region 150 and the drain region 173 in the first region R1 of the substrate 100.

The fourth insulating portion 144 may be disposed at one side of the first source region 171 and the other side of the second source region 172.

The first insulating portion 141, the second insulating portion 142, the third insulating portion 143, and the fourth insulating portion 144 may include an insulating material. The first insulating portion 141, the second insulating portion 142, the third insulating portion 143, and the fourth insulating portion 144 may include, for example, one of an oxide film, a nitride film, an oxynitride film, or a combination thereof.

Although no contact is shown in FIG. 1 for clarity of illustration, contacts may be disposed on the first source region 171, the drain region 173, the second source region 172, the first gate connection portion 161, and the second gate connection portion 162. For example, there may be no contact disposed on the first gate electrode 111, the second gate electrode 112, the third gate electrode 113, and the fourth gate electrode 114.

The semiconductor device according to the embodiment of the disclosure includes the connection region 150 that connects the first common region 121, the first body region 131, the second body region 132, and the second common region 122 in the second region R2 of the substrate 100, so that the transistors may be stabilized by stabilizing the current flowing through the first common region 121 and the second common region 122.

Figure 2:
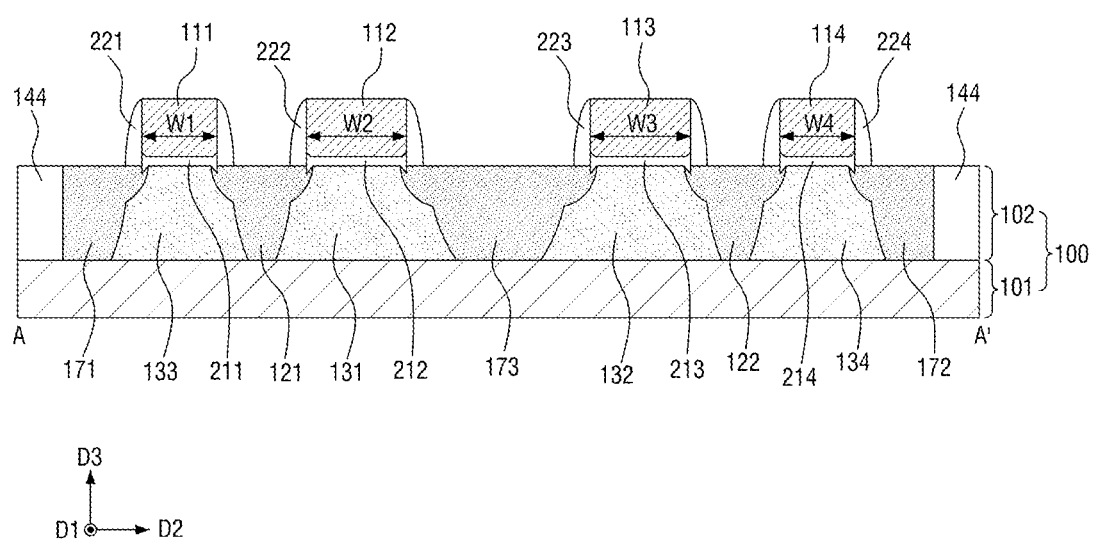
FIG. 2 illustrates a cross-sectional view taken along line A-A' of FIG. 1.

FIG. 2 illustrates a cross-sectional view taken along line A-A' of FIG. 1.

Referring to FIG. 1 and FIG. 2, the substrate 100 of the semiconductor device may include a first portion 101 and a second portion 102.

The first portion 101 of the substrate 100 may include p-type impurities. The second portion 102 of the substrate 100 may be disposed on the first portion 101. The first source region 171, the second source region 172, the drain region 173, the first body region 131, the second body region 132, the third body region 133, and the fourth body region 134 may be included in the second portion 102 of the substrate 100.

The fourth insulating portion 144 may be disposed on the first portion 101 of the substrate 100.

The first source region 171 may be disposed on the first portion 101 of the substrate 100 and in the second portion 102 thereof. A portion of the first source region 171 may overlap the first gate electrode 111 in a third direction D3. The third direction D3 may be a direction crossing the first direction D1 and the second direction D2. The third direction D3 may be, for example, a direction protruding from an upper surface of the substrate 100. The first source region 171 may be connected to the first portion 101 of the substrate 100. For example, the first source region 171 may directly contact the first portion 101 of the substrate 100.

The first common region 121 may be disposed on the first portion 101 of the substrate 100 and in the second portion 102 thereof. A portion of the first common region 121 may overlap each of the first gate electrode 111 and the second gate electrode 112 in the third direction D3. The first common region 121 may be connected to the first portion 101 of the substrate 100. For example, the first common region 121 may directly contact the first portion 101 of the substrate 100.

The third body region 133 may be disposed on the first portion 101 and in the second portion 102 of the substrate 100. The third body region 133 may be disposed between the first gate electrode 111 and the first portion 101 of the substrate 100. The third body region 133 may be connected to the first portion 101 of the substrate 100. For example, the third body region 133 may directly contact the first portion 101 of the substrate 100. The third body region 133 may be disposed between the first source region 171 and the first common region 121. The third body region 133 may include p-type impurities.

The drain region 173 may be disposed on the first portion 101 of the substrate 100 and in the second portion 102 of the substrate 100. A portion of the drain region 173 may overlap each of the second gate electrode 112 and the third gate electrode 113 in the third direction D3. The drain region 173 may be connected to the first portion 101 of the substrate 100. For example, the drain region 173 may directly contact the first portion 101 of the substrate 100.

The first body region 131 may be disposed on the first portion 101 of the substrate 100 and in the second portion 102 of the substrate 100. The first body region 131 may be disposed between the second gate electrode 112 and the first portion 101 of the substrate 100. The first body region 131 may be connected to the first portion 101 of the substrate 100. For example, the first body region 131 may directly contact the first portion 101 of the substrate 100. The first body region 131 may be disposed between the first common region 121 and the drain region 173. The first body region 131 may include p-type impurities.

The second common region 122 may be disposed on the first portion 101 of the substrate 100 and in the second portion 102 of the substrate 100. A portion of the second common region 122 may overlap each of the third gate electrode 113 and the fourth gate electrode 114 in the third direction D3. The second common region 122 may be connected to the first portion 101 of the substrate 100. For example, the second common region 122 may directly contact the first portion 101 of the substrate 100.

The second body region 132 may be disposed on the first portion 101 of the substrate 100 and in the second portion 102 of the substrate 100. The second body region 132 may be disposed between the third gate electrode 113 and the first portion 101 of the substrate 100. The second body region 132 may be connected to the first portion 101 of the substrate 100. For example, the second body region 132 may directly contact the first portion 101 of the substrate 100. The second body region 132 may be disposed between the second common region 122 and the drain region 173. The second body region 132 may include p-type impurities.

The second source region 172 may be disposed on the first portion 101 of the substrate 100 and in the second portion 102 of the substrate 100. A portion of the second source region 172 may overlap the fourth gate electrode 114 in the third direction D3. The second source region 172 may be connected to the first portion 101 of the substrate 100. For example, the first source region 171 may directly contact the first portion 101 of the substrate 100.

The fourth body region 134 may be disposed on the first portion 101 of the substrate 100 and in the second portion 102 of the substrate 100. The fourth body region 134 may be disposed between the fourth gate electrode 114 and the first portion 101 of the substrate 100. The fourth body region 134 may be connected to the first portion 101 of the substrate 100. For example, the fourth body region 134 may directly contact the first portion 101 of the substrate 100. The fourth body region 134 may be disposed between the second common region 122 and the drain region 173. The fourth body region 134 may include p-type impurities.

In the semiconductor device according to the embodiment of the disclosure, the body regions 131, 132, 133, and 134 are connected to the first portion 101 of the substrate 100 in the third region R3, so that resistance between the first common region 121 and the drain region 173 and resistance between the second common region 122 and the drain region 173 may be increased, thereby increasing the amplification gain of the transistors.

A first gate structure may include the first gate electrode 111, a first gate insulating film 211, and a first spacer 221. A fourth gate structure may include the fourth gate electrode 114, a fourth gate insulating film 214, and a fourth spacer 224.

The first gate insulating film 211 may be disposed between the first gate electrode 111 and the substrate 100. The fourth gate insulating film 214 may be disposed between the fourth gate electrode 114 and the substrate 100.

The first gate connection portion 161 may further include a gate insulating film between the first gate connection portion 161 and the substrate 100. The gate insulating film disposed below the first gate connection portion 161 may be connected to each of the first gate insulating film 211 and the fourth gate insulating film 214.

The first spacer 221 may be disposed on at least one sidewall of the first gate electrode 111. The fourth spacer 224 may be disposed on at least one sidewall of the fourth gate electrode 114. The first spacer 221 and the fourth spacer 224 may include, for example, at least one of a silicon nitride (SiN), a silicon oxynitride (SiON), a silicon oxide (SiO$_2$), a silicon oxycarbonitride (SiOCN), or a combination thereof.

The first gate connection portion 161 may further include a spacer disposed on at least one sidewall of the first gate connection portion 161. The spacer disposed on at least one sidewall of the first gate connection portion 161 may be connected to each of the first spacer 221 and the fourth spacer 224.

A second gate structure may include the second gate electrode 112, a second gate insulating film 212, and a second spacer 222. A third gate structure may include the third gate electrode 113, a third gate insulating film 213, and a third spacer 223.

The second gate insulating film 212 may be disposed between the second gate electrode 112 and the substrate 100. The third gate insulating film 213 may be disposed between the third gate electrode 113 and the substrate 100.

The second gate connection portion 162 may further include a gate insulating film between the second gate connection portion 162 and the substrate 100. The gate insulating film disposed below the second gate connection portion 162 may be connected to each of the second gate insulating film 212 and the third gate insulating film 213.

The second spacer 222 may be disposed on at least one sidewall of the second gate electrode 112. The third spacer 223 may be disposed on at least one sidewall of the third gate electrode 113. The second spacer 222 and the third spacer 223 may include, for example, at least one of a silicon nitride (SiN), a silicon oxynitride (SiON), a silicon oxide (SiO$_2$), a silicon oxycarbonitride (SiOCN), or a combination thereof.

The second gate connection portion 162 may further include a spacer disposed on at least one sidewall of the second gate connection portion 162. The spacer disposed on at least one sidewall of the second gate connection portion 162 may be connected to each of the second spacer 222 and the third spacer 223.

In some embodiments, a width W2 of the second gate electrode 112 in the second direction D2 and a width W3 of the third gate electrode 113 in the second direction D2 may be larger than a width W1 of the first gate electrode 111 in the second direction D2 and a width W4 of the fourth gate electrode 114 in the second direction D2.

Figure 3:
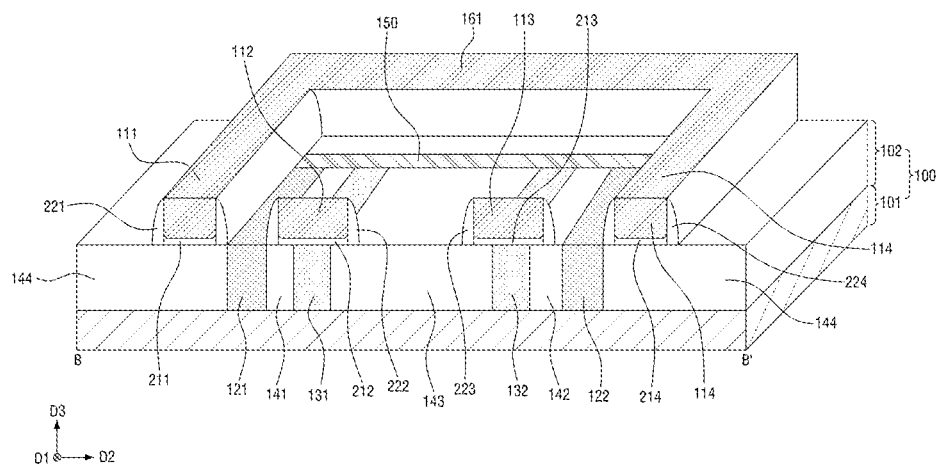
FIG. 3 illustrates a cross-sectional perspective view taken along B-B' of FIG. 1.

FIG. 3 illustrates a cross-sectional perspective view taken along B-B' of FIG. 1.

Referring to FIG. 1, FIG. 2, and FIG. 3, the first common region 121 and the second common region 122 of the semiconductor device may be connected to the first portion 101 of the substrate 100 in the first region R1 of the substrate 100.

The first body region 131 and the second body region 132 may be connected to the first portion 101 of the substrate 100 in the first region R1 of the substrate 100.

Compared to FIG. 2, the first insulating portion 141 may be further included in the first region R1 of the substrate 100. The first insulating portion 141 may be disposed between the first common region 121 and the first body region 131. The first insulating portion 141 may be disposed on the first portion 101 of the substrate 100, and may be disposed in the second portion 102 thereof. The first insulating portion 141 may be connected to the first portion 101 of the substrate 100.

Compared to FIG. 2, the second insulating portion 142 may be further included in the first region R1 of the substrate 100. The second insulating portion 142 may be disposed between the second common region 122 and the second body region 132. The second insulating portion 142 may be disposed on the first portion 101 of the substrate 100, and may be disposed in the second portion 102 thereof. The second insulating portion 142 may be connected to the first portion 101 of the substrate 100.

Compared to FIG. 2, the third insulating portion 143 may be further included in the first region R1 of the substrate 100 instead of the drain region 173. The third insulating portion 143 may be disposed between the first body region 131 and the second body region 132. The third insulating portion 143 may be disposed between the drain region 173 of the third region R3 of the substrate 100 and the connection region 150 of the first region R1 of the substrate 100. The third insulating portion 143 may be disposed on the first portion 101 of the substrate 100, and may be disposed in the second portion 102 thereof. The third insulating portion 143 may be connected to the first portion 101 of the substrate 100.

Compared to FIG. 2, in the first region R1 of the substrate 100, instead of the first source region 171 and the third body region 133, the fourth insulating portion 144 may further extend below the first gate electrode 111 and the fourth gate electrode 114. In the first region R1 of the substrate 100, a portion of the fourth insulating portion 144 may overlap each of the first gate electrode 111 and the fourth gate electrode 114 in the third direction D3. In the first region R1 of the substrate 100, a portion of the fourth insulating portion 144 may be disposed between the first gate electrode 111 and the first portion 101 of the substrate 100 and between the fourth gate electrode 114 and the first portion 101 of the substrate 100. In the first region R1 of the substrate 100, as the fourth insulating portion 144 further extends below the first gate electrode 111 and below the fourth gate electrode 114, the fourth insulating portion 144 may contact the first common region 121 and the second common region 122.

In the first region R1 of the substrate 100, the first gate connection portion 161 may be disposed to be spaced apart from the connection region 150. An insulating portion may be disposed between the first gate connection portion 161 and the connection region 150.

The foregoing description is merely illustrative of the technical spirit of the embodiment. It will be appreciated by those skilled in the art that various modifications and alterations can be made without departing from the essential characteristics of the embodiment. Therefore, the embodiments of the disclosure have not been described for limiting purposes, and the scope of the spirit of the disclosure is not limited by these embodiments. The protection range of the embodiment should be construed by the claims below, and all technical ideas within an equivalent range thought should be construed as being included within the scope of the embodiment.

What is claimed is:

1. A semiconductor device comprising:
    a substrate including first and second regions that are different from each other and a third region between the first and second regions;
    a first gate electrode of a first transistor extending along a first direction on the third region of the substrate;
    a second gate electrode of a second transistor spaced apart from the first gate electrode in a second direction crossing the first direction on the third region of the substrate and extending along the first direction;
    a first common region extending from the third region to the first region along the first direction in the substrate and disposed between the first gate electrode and the second gate electrode in the substrate;
    a first body region extending from the third region to the first region along the first direction and disposed below the second gate electrode;
    a first insulating portion between the first common region and the first body region in the first region; and
    a connection region connecting the first common region, the first body region and the first insulating portion in the first region,
    wherein the connection region is disposed to be spaced apart from an end of the second gate electrode along the first direction, and
    the first insulating portion extends from the end of the second gate electrode toward the connection region along the first direction in the substrate.

2. The semiconductor device of claim 1, wherein the substrate includes a first portion and a second portion on the first portion, and
    the first body region is disposed in the second portion of the substrate and is connected to the first portion of the substrate.

3. The semiconductor device of claim 2, wherein the first common region is disposed in the second portion of the substrate and is connected to the first portion.

4. The semiconductor device of claim 1, further comprising:
    a third gate electrode of a third transistor extending along the first direction and spaced apart from the second gate electrode in the second direction on the third region of the substrate;
    a fourth gate electrode of a fourth transistor extending along the first direction and spaced apart from the third gate electrode in the second direction on the third region of the substrate;
    a second common region extending from the third region to the first region along the first direction and disposed between the third gate electrode and the fourth gate electrode;
    a second body region extending from the third region to the first region along the first direction and disposed below the third gate electrode; and
    a second insulating portion between the second common region and the second body region, in the first region,
    wherein the connection region connects the second common region and the second body region in the first region.

5. The semiconductor device of claim 4, wherein the substrate includes a first portion and a second portion on the first portion,
    the first body region is disposed in the second portion of the substrate and is connected to the first portion between the second gate electrode and the first portion, and
    the second body region is disposed in the second portion of the substrate and is connected to the first portion between the third gate electrode and the first portion.

6. The semiconductor device of claim 5, wherein each of the first common region and the second common region is disposed in the second portion of the substrate and is connected to the first portion.

7. The semiconductor device of claim 4, further comprising a third insulating portion between the first body region and the second body region in the first region.

8. The semiconductor device of claim 4, further comprising:
    a first gate connection portion connecting the first gate electrode and the fourth gate electrode to each other in the first region; and
    a second gate connection portion connecting the second gate electrode and the third gate electrode to each other in the second region.

9. The semiconductor device of claim 1, wherein the first common region and the first body region do not extend to the second region.

10. The semiconductor device of claim 1, wherein a width of the second gate electrode in the second direction is larger than a width of the first gate electrode in the second direction.

* * * * *